United States Patent [19]

Cassat

[11] Patent Number: 4,799,996
[45] Date of Patent: Jan. 24, 1989

[54] METALLIZABLE SUBSTRATE COMPOSITES AND PRINTED CIRCUITS PRODUCED THEREFROM

[75] Inventor: Robert Cassat, Ternay, France

[73] Assignee: Ciba-Geigy Corporation, Ardsley, N.Y.

[21] Appl. No.: 78,166

[22] Filed: Jul. 27, 1987

Related U.S. Application Data

[60] Division of Ser. No. 11,359, Feb. 2, 1987, Pat. No. 4,714,653, which is a continuation of Ser. No. 666,036, Oct. 29, 1984, abandoned.

[30] Foreign Application Priority Data

Oct. 28, 1983 [FR] France ............................. 83 17507

[51] Int. Cl.$^4$ ............................................. D21H 1/48
[52] U.S. Cl. ........................................ 162/136; 148/6; 148/6.14 R; 162/138; 162/145; 162/152; 162/164.3; 162/164.6; 162/165; 162/166; 162/181.5; 162/181.9

[58] Field of Search ............... 162/135, 138, 145, 146, 162/181.5, 181.9, 165, 166, 164.3, 136, 128, 125, 152, 164.6; 427/96, 121, 126.3, 342; 148/6, 6.14 R

[56] References Cited

U.S. PATENT DOCUMENTS 4,541,894 9/1985 Cassat ................................. 162/138

Primary Examiner—Peter Chin
Attorney, Agent, or Firm—Harry Falber

[57] ABSTRACT

Substrate composites, well adopted for the production of metallized printed circuits and facilely prepared by, e.g., papermaking procedures, include a central core layer comprising fibrous cellulosic material or flaked mica within a matrix of a thermosetting resin binder, said central core element having coextensively laminated to at least one of the face surfaces thereof, a lamina of a thermosetting resin comprising non-conductive metal oxide filler material distributed therethrough, and said metal oxide being borohydride reduceable and reactive to form unstable metal hydride intermediates.

23 Claims, No Drawings

METALLIZABLE SUBSTRATE COMPOSITES AND PRINTED CIRCUITS PRODUCED THEREFROM

This application is a divisional, of application Ser. No. 011,359, filed Feb. 2, 1987 now U.S. Pat. No. 4,714,653, which is a continuation of application Ser. No. 666,036 filed Oct. 29, 1984 now abandoned.

BACKGROUND OF THE INVENTION

1. Field of the Invention

The present invention relates to substrates fabricated from a reinforced polymeric material, which can be metallized by a reduction treatment followed, if appropriate, by electrolytic metallization, which metallized substrates are well adopted for the manufacture of printed circuits. The invention also relates to such metallized substrates, per se, ofttimes referred to simply as "metal-clad".

The present invention also relates to a process for the production of said substrates.

2. Description of the Prior Art

The metallized substrates are themselves well known to this art (cf. U.S. Pat. No. 4,110,147). Typically they comprise an electrically insulating support material, to either or both of the face surfaces of which is adhered a conductive metal sheet. This metal sheet may be in particular a sheet or foil of copper, aluminum, nickel, or stainless steel having a thickness ranging from 10 to 100 micrometers, depending upon the type of printed circuit sought to be produced.

The metallized substrates under consideration may be rigid, semi-rigid or flexible, depending upon the composition of the insulating support material. By "semi-rigid substrate" there is intended a material which can withstand an elastic deformation by bending same to a very small radius of curvature.

In the case of the rigid or semi-rigid metallized substrates, to which the present invention more particularly relates, the insulating support material is usually formed by the stacking of a number of prepregs, each of which comprises the combination, per se known to this art, of elongated reinforcing filler material within a matrix of a polymeric material. With a conventional reinforcing filler such as, for example, a glass cloth weighing 200 g/m$^2$ or an impregnated paper sheet, 6 to 12 prepregs are employed, on average. The conventional prepregs consist of cellulosic papers, cotton cloths or glass cloths impregnated with synthetic polymers. Phenol-formaldehyde resins, polyester resins, and, especially, epoxide resins are the materials employed most frequently. The reinforcing filler, paper or glass cloth, is generally impregnated with a solution of polymer in a suitable solvent, which permits good penetration of the polymeric binder between and among the filler fibers. The impregnated structure then is placed in an oven heated to a temperature which causes the solvent to evaporate. This technique is usually designated the "collodion route".

To manufacture of metallized substrates includes inserting, between the pressure plates of a press, the stack of prepregs which is covered with a metal sheet on one or both of the face surfaces thereof, depending on whether it is desired to produce a mono- or bimetallized substrate. Consolidation by pressing is then carried out at a temperature which permits lamination of the various components. In certain cases, the metal sheets require an adhesive interlayer to be permanently bonded to the prepregs.

For obvious economic reasons, it is desirable to increase manufacturing output by reducing the number of components, in particular the number of prepregs, which constitute the product laminate. This simplification at the manufacturing level should of course not be made at the expense of the mechanical and electrical properties of the final product.

It is also a desideratum in this art to produce metallizable and metallized substrates, the manufacture of which does not give rise to any environmental pollution. As heretofore mentioned, the preparation of the insulating support material typically entails a process for impregnating a series of reinforcing structures using a solution of polymer in a suitable solvent. In order to produce a prepreg which can be employed in the downstream operations, the solvent must be removed by drying. This removal of solvent, despite all of the precautions taken to recover the same, is frequently a cause of pollution. Other disadvantages which may be mentioned, which are also associated with the use of solvent are, on the one hand, its purchase price and, on the other, the large quantity of energy needed for its drying. Reduction in the number of prepregs, mentioned earlier, to simplify the manufacture of metallized substrates, thus, still appears to be one way of solving this pollution problem. Another way to solve or avoid this problem completely would be to abandon the collodion route for the preparation of the remaining prepregs.

SUMMARY OF THE INVENTION

Accordingly, a major object of the present invention is the provision of improved metallized and metallizable reinforced polymer substrates, and of an improved process for the preparation thereof, the same being conspicuously devoid of those disadvantages and drawbacks to data characterizing the state of this art, but which nonetheless exhibit all of those desiderata above outlined.

Another object of the present invention is the provision of metallized substrates for printed circuits which can easily be pierced by simple punching and whose internal composition makes it possible, by using this simple piercing technique, to obtain clean-walled holes for establishing electrical connections between the two face surfaces.

Briefly, the substrates according to this invention, which can facilely be metallized by a reduction treatment followed, if appropriate, by additive electrolyte metallization, and which are well adopted for the manufacture of printed circuits therefrom, include a central core element consisting essentially of cellulosic fibrous material and/or mica flakes and a thermosetting resin containing, if appropriate, an inert filler, and on one or both face surfaces thereof at least one layer produced from a thermosetting resin composition homogeneously filled with non-conductive metal oxide particulates, the degree of oxidation of which is selected such as to permit easy reduction with a borohydride and which is capable of forming unstable metal hydrides as intermediates.

DETAILED DESCRIPTION OF THE INVENTION

More particularly according to the present invention, the central core of the subject improved substrates advantageously essentially consists of cellulosic fibrous material and/or mica flakes and a thermosetting resin matrix incorporating, if appropriate, an inert filler material.

By the expression "cellulosic material" there is intended fibers made of natural cellulose or cellulose modified by chemical processes in the form of paper pulp, or more or less defibrillated such fibers.

The mica flakes employed are materials which are typically readily commercially available. These flakes may be employed in the crude or raw state but, in certain instances, in order to improve the cohesion between the mica and the matrix resin, it may be advantageous to subject them to a surface treatment which is per se known to this art.

The thermosetting resin comprising the central core is advantageously selected from among resins of the phenolic type such as, for example, condensates of phenol, resorcinol, cresol or xylenol with formaldehyde, furfural or acetaldehyde, or resins of the epoxy type such as, for example, the products of reaction of epichlorohydrin with bisphenol A.

These resins in the prepolymer state are most advantageously in powdery form to enable their use in a "papermaking" technique for the preparation of substrates consistent herewith, such technique being described in greater detail below.

Preferred are the powdered novolac phenolic resins containing hexamethylenetetramine as a hardening agent.

The central core may also incorporate inert, inorganic and pulverulent fillers such as silicates, carbonates, kaolin, chalk, powdered quartz, and the like.

The central core typically comprises from 50 to 90% by weight of the metallizable substrate. Its essential function is to ensure the filling of the metallizable substrate (or of the metallized substrate) to permit the said substrate to have the required thickness, a thickness on the order of 1 to 3 mm.

In the central core, the amount by weight of cellulosic material and/or mica flakes (reinforcing fillers relative to the combination of reinforcing fillers and resin) advantageously ranges from 20 to 90%, and preferably from 40 to 70%. As mentioned above, the central core of the topic substrates is coated on one or both face surfaces thereof with at least one layer produced from a thermosetting resin composition filled with a metal oxide having various desired characteristics.

Said thermosetting resin, which comprises 30 to 70% by weight of the composition, is preferably of the phenolic type or of the epoxy type as mentioned above, or more preferably is the type of polymer comprising imide groups such as polyamide-imides or polyimides. As such polyimides, preferred are prepolymers obtained from an N,N'-bisimide of an unsaturated dicarboxylic acid having the general formula:

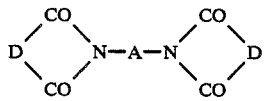

(1)

in which D denotes a divalent radical containing a carbon-carbon double bond and A is a divalent organic radical containing 2 to 30 carbon atoms, and a polyamine of the general formula:

R(NH$_2$)$_x$ (2)

in which x is an integer equal to at least 2 and R denotes an organic radical of valency x, the amount of bisimide ranging from 0.55 to 25 moles per molar group —NH$_2$ introduced by the polyamine.

The above polyimides are described in particular in French Pat. No. 1,555,564, but many derivatives of these polymers are also suitable. Thus, the polyimide resin can also be obtained by reaction between the bisimide, the polyamine and various adjuvants such as, for example, mono-imides (according to French Pat. No. 2,046,498), monomers, other than imides, containing one or more polymerizable groups of the type —CH=C= (according to French Pat. No. 2,094,607), unsaturated polyesters (according to French Pat. No. 2,102,878) or hydroxylated organosilicon compounds (according to French Pat. No. 2,422,696). In the case where such adjuvants are employed, it should be appreciated that the polyimide resin may be obtained either by directly heating together the three reactants (bisimide, polyamine and adjuvants), or by heating the reaction product or the mixture of the adjuvant with a prepolymer of bisimide and of polyamine prepared in advance.

In any event, prepolymers which are in powdered form are selected. Still more preferably, a polyimide resin is used which results from the reaction of a bismaleimide such as N,N'-4,4'-diphenylmethanebismaleimide and a primary diamine such as 4,4'-diaminodiphenylmethane and, if appropriate, one of the various above-mentioned adjuvants.

The prepolymers of the polyamide-imides which are useful as binders according to this invention comprise a plurality of recurring units of the general formula:

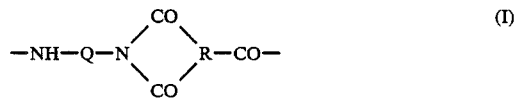

(I)

in which the symbol Q denotes a divalent radical containing at least one benzene ring and the symbol R denotes a trivalent aromatic radical.

Exemplary of the radicals denoted by Q, representative are the m-phenylene, p-phenylene, p,p'-diphenylene radicals, or radicals of the formula:

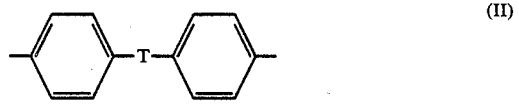

(II)

in which the symbol T can denote a divalent atom or linking bridge such as —O—, —CH$_2$—, —C(CH$_3$)$_2$—, —SO$_2$—, —N=N—.

Exemplary of radicals denoted by the symbol R, representative are trivalent radicals of the formulae:

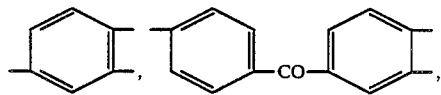,

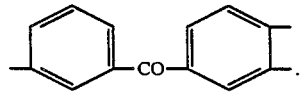.

The polyamide-imides described above can be prepared according to various methods, such as those described in British Pat. Nos. 570,878 and 1,281,446, 3,260,691, and French Pat. Nos. 1,386,617, 1,473,600, 1,501,198, 1,559,357 and 1,576,844.

Among these polyamide-imides, especially noteworthy are those obtained from trimellitic anhydride and a difunctional comonomer of the formula:

$$X-Q-X \qquad (III)$$

in which the symbol X denotes an NCO group or a group of the formula -NHCOR$_1$, with the symbol R$_1$ denoting an alkyl radical containing from 1 to 6 carbon atoms or a phenyl or methylphenyl radical.

Preferably, polyamide-imides are used which are in powder form. The polytrimellitamide-imides obtained from the reaction of trimellitic anhydride with 4,4'-diisocyanatodiphenylmethane or 4,4'-diisocyanatodiphenyl ether are eminently suitable for the production of substrates according to the invention.

As hereinbefore mentioned, the subject compositions include, in addition to the thermosetting resin discussed immediately above, a non-conductive metal oxide, the degree of oxidation of which is selected as to permit easy reduction thereof with a borohydride and which is capable of forming unstable metal hydrides as intermediates.

The said oxide which comprises from 30 to 70% by weight of the composition, is advantageously in the form of particles of very small size. Their particle size distribution preferably ranges from 0.1 to 5 micrometers. Advantageously, cuprous oxide is used. This composition can be in a pulverulent form or in the form of a dispersion in water, or in a mixture of water with a light solvent, or in solution form. If need be, it may additionally comprise up to 40% by weight of inert fillers, as mentioned earlier with respect to the central core.

Said compositions may be deposited onto a face surface of the central core by various means known per se: spraying by spraygun, tip-coating, blade-coating, etc.

In an alternative embodiment the outer layer or layers may also comprise a porous reinforcement sheet of a non-woven, or of paper, onto which the thermosetting composition is deposited. The combination, reinforcement sheet and coating, is situated on at least one face surface of the central core.

To prepare the metallizable substrates according to the present invention, a papermaking or wet process is advantageously used.

In accordance with such papermaking process, the combination of the various ingredients is incorporated directly in the admixture designated the "slurry" by paper manufacturers, namely, water together with the reinforcing filler (cellulosic material or mica) and the binder (thermosetting prepolymer) in the form of powder and, if appropriate, the inert filler. From this slurry a felt is then formed, on a papermaking machine, from which water is extracted, on the one hand by filtration and application of vacuum, and, on the other hand, by drying at a temperature on the order of 70° to 105° C., typically by passing the felt through a ventilated oven. In this felt, the binder is still in the prepolymer state. The felt prepared in this manner has a density of from 0.3 to 2, while, in the final stage, that is to say, after pressing of the felt and hardening or curing of the prepolymer, the density of the central core ranges from about 1.5 to 2.7.

Before or after compression of the felt prepared in this manner, one or both face surfaces are coated with a composition comprising the mixture of thermosetting resin and metal oxide, as above-outlined.

This composition, which can be in various forms, as aforesaid, can be deposited onto the surface of the felt by various known means, also as aforesaid.

The substrates obtained from the coated felt are cut to shape and then hot pressed. A flat press is typically used, operating at 10 to 300 bars and at a temperature above 70° C. It s possible to employ cycles during which the pressure and temperature are raised stepwise. This depends essentially upon the nature of the binder selected.

In the case of the preferred polyimide prepolymers obtained from a bisimide, a polyamine and, if appropriate, one of the above-mentioned adjuvants (generally having a softening point of from 50° to 200° C.), the pressing temperature advantageously ranges from 70° to 280° C. Preferably, in order to permit effective cohesion (or assembly) of the various components, the temperature is greater than 150° C.

These temperature conditions of pressing also apply to the other types of thermosetting prepolymers which are within the ambit of the present invention. In general, heating of the prepolymers makes it possible to effect their softening and their hardening in succession. The entire assembly may, of course, be post-cured.

The technique, immediately above described, for producing metallizable substrates according to the invention has numerous advantages.

As above-mentioned, production is simplified because of the use of a limited number of components and it is not necessary to carry out impregnation of the reinforcing structure by the collodion route, which causes pollution.

However, there are other advantages. The preparation of cardboard by the papermaking route is an efficient process. Moreover, the papermaking route permits recycling of waste; there is no difficulty in reintroducing the cardboard waste formed before pressing back into the slurry. Furthermore, it is observed that there is essentially no melting of polymer during the final hot pressing step, which is of very great interest when a polyimide is employed. Finally, this possibility of recycling, combined with practically no melting during pressing, ensures a very low loss of resin during production.

The hot-pressed forms, post-cured if appropriate, can then be subjected to downstream treatment with a view to the metallization thereof.

Such metallization can, indeed by carried out either by laminating a metal film to the surface of the substrate, or by depositing thereon a layer incorporating a substance which can be converted into free metal by a subsequent chemical treatment, or which will serve as a primer for a metal coating to be applied by an electrolytic or chemical route. It is possible to effect such metallization by direct chemical treatment of the substrate which has a surface layer of a compound capable of being converted into free metal, and then, where applicable, to strengthen same by means of additive electrolytic metallization; this constitutes an especially preferred embodiment of the present invention.

The chemical treatment of such substrate with a view towards the metallization thereof comprises the quantitative conversion of the metal oxide, and more particularly of cuprous oxide, to free metal by borohydride reduction according to the reaction:

$$4\ Cu_2O + BH_4^- \rightarrow 8\ Cu + B(OH)_3 + OH^-$$

It may be first necessary to physically expose the grains of metal oxide by suitable mechanical treatment (sanding, abrasive rollers, rubbing with an abrasive paste) and/or chemical treatment.

The borohydrides which may be employed for such purpose include the substituted borohydrides as well as the unsubstituted borohydrides. Substituted borohydrides in which at most three hydrogen atoms in the borohydride ion have been replaced by unreactive substituents such as, for example, alkyl radicals, aryl radicals, or alkoxy radicals, may be employed. Preferably used are the alkali metal borohydrides in which the alkali metal is sodium or potassium. Representative examples of compounds which are suitable are: sodium borohydride, potassium borohydride, sodium diethylborohydride, sodium trimethoxyborohydride and potassium triphenylborohydride.

The reducing treatment is carried out in a simple manner by placing the substrate or a form taken therefrom in contact with a solution of borohydride in water, or in a mixture of water and an inert polar solvent such as, for example, a lower aliphatic alcohol. Preferably, purely aqueous solutions of borohydride are used. The concentration of these solutions may vary over wide limits and preferably ranges from 0.05 to 1% by weight of active hydrogen of the borohydride relative to the solution. The reducing treatment may be carried out at elevated temperature, though it is preferred to carry it out at a temperature close to ambient temperature, for example, at from 15° C. to 30° C. As to the reaction mechanism, it will be appreciated that it gives rise to $B(OH)_3$ and to $OH^-$ ions, the effect of which is to produce an increase in the pH of the reaction medium during reduction. Now, at high pH values, for example above 13, the reduction is slowed to such extent that it may be advantageous to effect same in a buffered medium to provide a well-defined rate of reduction. After reduction the form is rinsed.

At the beginning of reduction, the reaction involves essentially only the grains of cuprous oxide which are at the surface of the substrate and which are in direct contact with the reducing agent. As a result of the catalytic effects of the copper metal, however, the reduction reaction will then proceed into the thickness or depth of the form and will do so even though the resins employed are not particularly hydrophilic in nature. Consequently, it is by relying principally on the duration of the treatment that it is possible to easily control the extent of the reduction. To produce a resistivity which corresponds to the required values, the duration of the treatment which is necessary is typically fairly short and, depending upon the amount of oxide incorporated into the substrate, typically ranges from about one minute to a quarter of an hour. For a given duration of treatment it is also possible to manipulate the rate of reduction by adding various reaction accelerators to the medium, such as, for example, boric acid, oxalic acid, citric acid, tartaric acid or metal chlorides such as cobalt(II) chloride, nickel(II) chloride, iron(II) chloride, manganese(II) chloride and copper(II) chloride.

Given the very finely divided state of the copper produced after the reducing treatment, it might be expected that its oxidation in air would be quite rapid. It has been found, however, that this is not the case and that the value of the surface resistivity of the form after reduction does not change upon storage for several days in open air.

It is therefore possible to store the reduced substrate in this state. By way of precaution, also envisaged are an incomplete rinsing to leave trace amounts of reducing agent on the face surfaces of the form, or the addition of a particular reducing agent to the rinse bath, for example hydroquinone, or the protection of the rinsed and dried form by coating same with a protective film, for example photoresist.

The reduced substrate may then be metallized by deposition thereon of a layer of copper, nickel or another metal. This metallization may be carried out by electrochemical means, but it has been found, and this is an especially preferred embodiment according to the invention, that it may also be carried out directly by electrolytic means. In some applications, a deposition of a metallic coating at least 20 microns thick is occasionally desired, such that the possibility of employing direct electrolytic means provides a process which is industrially quite profitable. It is possible, of course, to proceed, in a conventional manner, to first carry out an electrochemical metallization, and then to strengthen this first deposit with a subsequent electrolytic deposit. For a detailed description of the operating conditions appropriate for electrochemical metallization, reference is made to *Encyclopedia of Polymer Science and Technology*, volume 8, pages 658 to 661 (1968). The proportions of the components in the electrochemical bath, the duration of immersion of the form, temperature and the other operating conditions are determined in each particular case in a manner known per se to provide the best results.

Metallization by electrolysis is also well known; cf. in particular, *Encyclopedia of Polymer Science and Technology*, volume 8, pages 661 to 663 (1968). The suitably reduced form is the cathode and the metal to be deposited the anode. Both are immersed in an electrolyte through which a current is passed. For example, in the case of electrolytic copper plating, the deposited metal may be derived from monovalent or divalent copper and may originate from a cyanide-containing electrolyte (monovalent copper) or an electrolyte based on sulfate, pyrophosphate, or fluroborate (divalent copper). Several adjuvants may be added to the electrolyte: an alkali metal salt or alkaline earth metal salt, an acid (acid copper plating bath with copper sulfate) or a base (alkaline tin-plating bath with stannate) to increase the conductivity of the electrolyte; a buffering agent to avoid rapid variations in pH; substances modifying the structure of the electrodeposits, such as, for example colloids, surfactants, a phenol, a sulfonated phenol, an inorganic or organic brightener, or a levelling agent such as, for example, coumarin. The quality of the electrodeposit, be it a metal or a metal alloy, will depend upon the composition of the electrolyte and the physical conditions of electrolysis (temperature, density of cathodic and anodic currents, anode-cathode distance, surface conditioning of the electrodes, and the like); the adjustment of these various parameters will be carried out in each particular case in a manner known per se.

Depending upon the duration of the electrolytic treatment it is possible to produce metal layers whose thickness is on the order of one micrometer, layers keyed into the substance and having good cohesion, in contrast to the "electroless" deposits.

Being able to propagate the reduction reaction into the thickness or depth of the substrate makes it possible to provide the following advantages: during the metallization there will be deep anchoring of the deposited metal in the resin substrate; in the case of a weld with addition of metal forming an alloy, the alloy will also be able to migrate into the depths of the substrate because a real continuity of copper exists in the thickness of the substrate.

Substrates incorporating such a thin metal layer are of great interest for the production of printed circuits, because they make it possible, during subsequent etching treatments, to eliminate faults and, in particular, under-etching. It is thus possible to raise the density of the circuitry and to increase the reliability of the circuits.

It is self-evident that it is also possible to produce much thicker metal deposits, on the order of 20 to 50 micrometers, for example, deposits which correspond to the techniques employed at present for the production of printed circuits. It is similarly possible to deposit, by melting or electrolytically, layers of an alloy of the lead/tin type.

The production of printed circuits from reduced substrates can thus be carried out in accordance with the conventional additive processes and the production of circuits from substrates which are reduced and metallized by an electrolytic route, by conventional etching.

The process according to the invention therefore makes it possible to produce metallized substrates which incorporate a metal layer anchored within the polymer, which can have a thickness as low as one micron while at the same time being coherent and strong. This process is distinguished from the processes of the prior art as much by its simplicity as by its low cost and by the very large number of options available.

Moreover, the present technology can be adapted to the existing equipment. The possibilities of alternative embodiments are quite numerous, because at each stage of the process it is possible to interrupt it, for example, by storing the semi-finished product in order to continue at a later stage.

In order to further illustrate the present invention and the advantages thereof, the following specific examples are given, it being understood that same are intended only as illustrative and in nowise limitative.

EXAMPLE 1

Into a mixer fitted with a powerful stirring device, referred to as a "beater" in the papermaking arts, were charged:

(i) 2,000 l of water;
(ii) 150 kg of cellulosic fibers in the form of paper pulp;
(iii) additional water to adjust to a volume of approximately 3,000 l;
(iv) 115 kg of powdered novolac resin, containing 8% of hexamethylenetetramine (Resophene PB 1119, marketed by Rhone-Poulenc); and
(v) 15 l of a cationic starch solution, having a solids content of 5%.

After homogenization under vigorous stirring 4 l of colloidal silica were added, which were dispersed in the medium by stirring gently for a brief period of time.

The entire slurry was then fed to the headbox of a papermaking machine and processed thereon.

This machine comprised an endless metal cloth permitting natural drainage of the pulp in a first section and then forced drainage on vacuum chambers. After separation of the paper layer, the metal cloth was deblocked by powerful water jets on its return leg.

In the first section of the machine the uniformity of the deposit was ensured jointly by natural drainage and by a transverse motion of the pulp layer. This motion was imparted to the pulp by lateral slices which prevent the pulp from overflowing on either side of the cloth.

The water resulting from the drainage and from the washing of the cloth was collected together under the machine and recycled with the suspended fibers which it contained, for the preparation of the following slurry.

Care was taken that the pH remained below 11-12.

This system offered two advantages:

(a) the solid matter and particularly the resin which might not have been retained in the continuous sheet manufactured by this process were thus recycled;
(b) the contaminating waste was eliminated.

Nevertheless, water renewal was high and at least on the order of 15 to 20%. It corresponded to the water retained in the sheet which was removed when the latter was dried.

The continuous sheet, after being passed over the suction boxes and being separated from the metal cloth support, had a thickness of 5 to 8 mm, depending on the extent of drainage, on the degree of refining of the paper pulp employed, and on whether or not a calendar roll exerting pressure on the cylinder for bypass of the metal cloth was employed.

This sheet, supported by a belt travelling at the same speed as the metal mesh employed in the production thereof, namely, approximately 2 m/min, had a width of 2.50 m. It was continuously trimmed by two air jets which reduced its size to 2.20 m by removing on either side the edges whose thickness was not constant.

The scrap was recovered continuously; it could be recycled and was incorporated in the slurries used in the following examples.

EXAMPLE 2

The procedure of Example 1 was repeated, using:

(i) 100 kg of cellulosic fibers;
(ii) 100 kg of 16 mesh muscovite mica previously treated with 1% by weight of vinyltriethoxysilane; and
(iii) 120 kg of novolac phenolic resin containing 8% of hexamethylenetetramine.

EXAMPLE 3

The procedure of Example 1 was again repeated, using:

(i) 130 kg of cellulosic fibres in the form of paper pulp;
(ii) 50 kg of water-dispersible glass fibers having a length of from 10 to 30 mm;
(iii) 120 kg of novolac phenolic resin containing 8% of hexamethylenetetramine.

EXAMPLE 4

The procedure of Example 1 was again repeated, using:

(i) 150 kg of cellulosic fibers in the form of paper pulp;
(ii) 15 kg of PB fluid;
(iii) 50 kg of novolac phenolic resin containing 5 to 10% of hexamethylenetetramine.

EXAMPLE 5

(formation of a sheet without resin)

A papermaking slurry was prepared by successively introducing into a mixer, under vigorous stirring, as in Example 1:

(i) 2,000 l of water;
(ii) 15 kg of KEVLAR in the form of pulp;
(iii) 200 kg of cellulosic fibers in the form of paper pulp;
(iv) additional water to adjust to a volume of 3,000 l;
(v) 50 kg of 3 mm glass fibers;
(vi) 15 l of a cationic starch solution.

Vigorous stirring of the mixture was then terminated.

(vii) 4 l of colloidal silica solution were then dispersed in this medium, under a minimum of agitation.

The slurry was transferred into the headbox of a papermaking machine and a continuous sheet produced thereon, 7 mm in thickness, 2.5 m wide, trimmed to 2.2 m by side air jets. The speed of formation of the sheet was 2 m/min.

EXAMPLE 6

A papermaking slurry was prepared by successively introducing into a mixer, under vigorous stirring, as in Example 1:

(i) 2,000 l of water;
(ii) 5 kg of BX polynosic fibers, having an average length of approximately 5 mm;
(iii) 150 kg of cellulosic fibers in the form of paper pulp;
(iv) additional water to adjust to a volume of 3,000 l;
(v) 90 kg of washed ceramic fibers (devoid of nonfibrous particles);
(vi) 15 l of cationic starch solution.

After careful homogenization, the stirring was terminated.

(vii) 4 l of colloidal silica solution were then dispersed in the medium under a minimum of agitation.

The slurry was transferred into the headbox of a papermaking machine. A continuous sheet was produced which had a thickness of 5 mm, a width of 2.5 m, trimmed to 2.20 m by two side air jets. The rate of formation of the sheet was 2 m/min.

EXAMPLE 7

The sheets resulting from Examples 5 and 6 had good mechanical behavior although they had not been dried. In this example, they were continuously immersed in an aqueous alcoholic solution of Resol (Resophene PL 3598) containing 55% of resin which had been rediluted to half strength with a mixture of water and alcohol.

At the outlet of the impregnating trough the sheet was calendered between two rolls to regulate the amount of resin retained.

The sheet was then dried in a ventilated oven for 5 min at 140° C.

EXAMPLE 8

The sheets produced in Examples 1, 2, 3, 4 and 7, after drying in a ventilated oven, were impregnated by immersion in an aqueous alcohol solution of resin, as in Example 7, containing 50% by weight (relative to the resin) of cuprous oxide in suspension ($Cu_2O$ diameter approximately 1 micrometer). The impregnated sheets were dried in a ventilated oven for 5 min. at 140° C.

EXAMPLE 9

Sheets produced as in Examples 1, 2, 3, 4 and 7, after drying in a ventilated oven, were impregnated with an aqueous alcoholic solution of Resol filled with 50% of $Cu_2O$ (particle diameter approximately 1 micrometer). This impregnation was carried out by spraying the solution of the filled Resol onto the upper face surface of the dried sheet.

EXAMPLE 10

Sheets produced as in Examples 1, 2, 3 and 4 were subjected to the treatment described in Example 9, but prior to oven drying.

EXAMPLE 11

The procedures of Examples 9 and 10 were repeated, except that the impregnation resin did not contain any $Cu_2O$.

The coated sheets were passed under a "Saladin" head which delivered dry $Cu_2O$ and dusted the impregnated face surface thereof.

The Saladin head consisted of a metal cylinder, the surface of which was embossed (the length of its generating line corresponded to the useful width of the coated sheet). This cylinder was surmounted by a hopper for feed of the $Cu_2O$ powder.

As it rotated, the embossed cylinder dragged off a little $Cu_2O$ which was separated from the cylinder and fell onto the sheet, by means of a brush which was also cylindrical, having an axis parallel to that of the cylinder, and whose bristles were tangential to the cylinder.

The rate of flow of the $Cu_2O$ was controlled by the flow from the hopper, the speed of rotation of the embossed roll and of the brush and the travelling speed of the sheet.

The amount of $Cu_2O$ deposited per $m^2$ of sheet was approximately 15 to 16 $g/m^2$.

EXAMPLE 12

A kraft paper, 120 $g/m^2$, which had already been impregnated with a phenolic resin (Resophene PL 3598) followed by drying for 5 min at 150° C., was coated with about 30 $g/m^2$ of resin.

In this case, the composition of the filled resin was:
33% of pure phenolic resin (Resol PL 4531 marketed by Rhone-Poulenc);
33% of resin solvent;
33% of $Cu_2O$.

The coating was carried out in "open bath", the homogeneity of the suspension being ensured by submerged circulation of the impregnating trough using a circulating pump.

The paper emerging from the bath was calibrated by passing same between two fixed doctor blades situated above the bath such that the excess resin fell back into the bath.

The impregnated paper was then continuously dried in a ventilated oven for 3 min at approximately 100° C.

The final weight of the coated paper was 370 $g/m^2$, subdivided as follows:
(a) paper: 120 g
(b) Résol PL 3598: 30 g
(c) Résol PL 4531: 125 g
(d) $Cu_2O$: 95 g

EXAMPLE 13

Forms or samples having dimensions of approximately 100×100 cm were taken from the sheets produced in Examples 8, 9 and 10. These dry forms, in which the resin was present in an unhardened form, were hot pressed for 50 min at 160° C. in a cycle which gradually increased the pressure from 20 MPa to 90 MPa. The pressed plates which resulted were brick red in color and had a thickness which varied from 1.5 to 1.7 mm.

Forms having dimensions of 20×20 cm were cut from these plates and their surfaces were stripped by sanding.

EXAMPLE 14

Forms having dimensions of approximately 100×100 cm were obtained from the sheets produced in Example 7.

Similarly, forms having dimensions of approximately 100×100 cm were cut from the papers coated according to Example 12.

Laminates consisting respectively of one layer of coated paper, one form and another layer of coated paper were produced.

The laminates obtained were hot pressed for 45 min at 160° C., the pressure gradually being increased from 20 MPa to 90 MPa. The pressed specimens were homogeneous, did not delaminate and had brick red colored face surfaces. They were approximately 1.9 to 2 mm thick. Forms having dimensions of 20×20 cm were cut from these specimens and their face surfaces were stripped by sanding.

EXAMPLE 15

Forms or samples obtained in accordance with Examples 13 and 14 were taken. These forms were treated with the following reducing solution:

Into a 1,000 ml conical flask there were introduced, in that order, under stirring and after dilution of each component:

(i) 500 ml of distilled water,
(ii) 2.5 g of caustic soda pellets,
(iii) 5 g of the sodium salt of a carboxymethylcellulose (type 7 ME, "medium viscosity", PM 250 000 marketed by HERCULES),
(iv) 25 g of potassium borohydride,
(v) 5 cm$^3$ of a 1% strength aqueous solution of Cemulsol DB 311 from SFOS.

The substrate was coated with the reducing solution and, after 3 min of contact time, the solution and the reaction byproducts were removed by washing with distilled water, accompanied by gentle brushing. The substrate was washed with alcohol and dried. The electrical resistance measured between two surface points separated by approximately 20 centimeters, using point electrodes, varied from 10 to 70 ohms.

The surface was copper-plated and conducted electricity. The plate thus obtained was then subjected to the usual operations which made it possible to manufacture a double-faced printed circuit therefrom, i.e.:

(1) deposition of photoresist on both sides;
(2) exposure to sunlight through a mask on both sides;
(3) development of the photoresist;
(4) electrolytic strengthening in an acid bath of copper sulfate with a copper anode, in the photoresist-free regions.

When the thickness of the deposite reached about 30 micrometers in less than one hour, the circuit was rinsed with water.

(5) stripping of the remaining photoresist;
(6) non-selective etching with ferric chloride up to the point of complete disappearance of the copper in the unstrengthened regions;
(7) after rinsing with water, rapid immersion in a dilute sulfuric acid bath to impart a shiny appearance to the circuit;
(8) careful rinsing with distilled water, then with alcohol and finally drying.

Upon completion of the aforesaid steps (1) through (8), a double-faced printed circuit was produced.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A process for the production of a substrate composite, said composite including a central core layer comprising fibrous cellulosic material or flaked mica within a matrix of a thermosetting resin binder, said central core element having coextensively laminated to at least one of the face surfaces thereof, a lamina of a thermosetting resin comprising a particulate array of non-conductive metal oxide filler material distributed therethrough, at least a portion of said metal oxide being borohydride reduced to form unstable metal hydride intermediates into the depth of said lamina, said process comprising (i) preparing an aqueous papermaking slurry of a powder of said thermosetting resin and said fibrous cellulosic material or said flaked mica comprising said central core layer, (ii) papermaking a sheet member of same by removal of water therefrom, (iii) consolidating and drying said sheet member, (iv) coating at least one of the face surfaces of said sheet member with said thermosetting resin comprising non-conductive metal oxide filler material distributed therethrough, and (v) thence consolidating said coated sheet member.

2. The process as defined by claim 1, wherein said consolidating step (v) concomitantly effects hardening of said thermosetting resins.

3. The process as defined by claim 1, wherein said central core layer essentially consists of fibrous cellulosic material within a matrix of a thermosetting resin binder.

4. The process as defined by claim 1, wherein said central core layer essentially consists of flaked mica within a matrix of a thermosetting resin binder.

5. The process as defined by claim 1, wherein said central core layer further comprises inert filler material distributed therethrough.

6. The process as defined by claim 3, wherein said central core layer further comprises inert filler material distributed therethrough.

7. The process as defined by claim 4, wherein said central core layer further comprises inert filler material distributed therethrough.

8. The process as defined by claim 1, wherein said thermosetting resin binder comprising said central core layer comprises a phenolic resin.

9. The process as defined by claim 1, wherein said at least one thermosetting resin lamina comprises a phenolic resin, epoxide resin, or imido resin.

10. The process as defined by claim 1, wherein said at least one thermosetting resin lamina comprises porous cellulosic reinforcing means.

11. The process as defined by claim 9, wherein said at least one thermosetting resin lamina comprises the polymer of an imido prepolymer.

12. The process as defined by claim 1, wherein said non-conductive metal oxide comprises cuprous oxide.

13. The process as defined by claim 1, wherein said central core layer comprises from 50 to 90% of the total weight thereof.

14. The process as defined by claim 13, wherein said central core layer has a thickness ranging from about 1 to 3 mm.

15. The process as defined by claim 13, wherein said central core layer comprises from 40 to 70% by weight of said fibrous cellulosic material or flaked mica.

16. The process as defined by claim 1, wherein said at least one thermosetting resin lamina comprises from 30 to 70% by weight of particulate metal oxide.

17. The process as defined by claim 1, wherein said at least one thermosetting resin lamina further comprises a filler material therefor.

18. The process as defined by claim 1, wherein a fraction of the metal oxide filler material comprising said at least one thermosetting resin lamina is physically exposed at the outer face surface thereof.

19. The process as defined by claim 1, wherein at least a portion of said metal oxide filler material is reduced to free metal.

20. The process as defined by claim 19, wherein the substrate composite further comprises an additive metallic overlayer confronting said at least one thermosetting resin lamina.

21. The process as defined by claim 1, wherein said thermosetting resins are in hardened state.

22. The process as defined by claim 19, wherein said thermosetting resins are in hardened state.

23. The process as defined in claim 20, wherein said thermosetting resins are in hardened state.

* * * * *